(12) United States Patent
Kong et al.

(10) Patent No.: US 10,606,316 B2
(45) Date of Patent: Mar. 31, 2020

(54) FLEXIBLE COMPUTING DEVICE THAT INCLUDES A PLURALITY OF DISPLAYS

(71) Applicant: Intel Corporation, Santa Clara, CA (US)

(72) Inventors: Jackson Chung Peng Kong, Tanjung Tokong (MY); Kooi Chi Ooi, Glugor (MY); Bok Eng Cheah, Bukit Gambir (MY); Eng Huat Goh, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/778,383

(22) PCT Filed: Dec. 10, 2015

(86) PCT No.: PCT/US2015/065080
§ 371 (c)(1),
(2) Date: May 23, 2018

(87) PCT Pub. No.: WO2017/099784
PCT Pub. Date: Jun. 15, 2017

(65) Prior Publication Data
US 2018/0348823 A1    Dec. 6, 2018

(51) Int. Cl.
*G06F 1/16* (2006.01)
*H05K 1/02* (2006.01)
(Continued)

(52) U.S. Cl.
CPC .......... *G06F 1/1652* (2013.01); *G06F 1/1647* (2013.01); *G06F 1/1656* (2013.01);
(Continued)

(58) Field of Classification Search
USPC ....................................................... 361/749
See application file for complete search history.

(56) References Cited

U.S. PATENT DOCUMENTS

2012/0018884 A1*  1/2012  Lin ..................... H01L 23/3107
                                                    257/738
2014/0097429 A1   4/2014  Kim et al.
(Continued)

FOREIGN PATENT DOCUMENTS

WO    WO-2013062707 A1    5/2013
WO    WO-2017099784 A1    6/2017

OTHER PUBLICATIONS

"International Application Serial No. PCT US2015 065080, International Preliminary Report on Patentability dated Jun. 21, 2018", 11 pgs.

(Continued)

*Primary Examiner* — Andargie M Aychillhum
(74) *Attorney, Agent, or Firm* — Schwegman Lundberg & Woessner, P.A.

(57) ABSTRACT

A flexible electronic device that includes a flexible substrate having an upper surface and a lower surface and interconnects extending between the upper surface and the lower surface; a flexible display mounted directly to the upper surface of the flexible substrate such that the flexible display is electrically connected to the flexible substrate; a first encapsulant mounted to the upper surface of the flexible substrate such that the flexible display is at least partially embedded within the first encapsulant; an electronic component mounted to a lower surface of the flexible substrate such that the electronic component is electrically connected to the flexible substrate; a second encapsulant mounted to the lower surface of the flexible substrate such that the electronic component is at least partially embedded within the second encapsulant; a flexible casing that surrounds the electronic component and the second encapsulant.

19 Claims, 5 Drawing Sheets

(51) Int. Cl.
*H05K 1/03* (2006.01)
*H05K 1/18* (2006.01)
*H05K 3/00* (2006.01)
*H05K 3/28* (2006.01)

(52) U.S. Cl.
CPC .......... *H05K 1/028* (2013.01); *H05K 1/0393* (2013.01); *H05K 1/186* (2013.01); *H05K 1/189* (2013.01); *H05K 3/007* (2013.01); *H05K 3/284* (2013.01); *G06F 1/163* (2013.01); *H05K 2201/0154* (2013.01); *H05K 2201/10128* (2013.01); *H05K 2201/10151* (2013.01); *H05K 2203/1316* (2013.01)

(56) References Cited

U.S. PATENT DOCUMENTS

| | | |
|---|---|---|
| 2014/0240985 A1 | 8/2014 | Kim et al. |
| 2015/0171134 A1* | 6/2015 | Couture ............ H01L 27/14632 250/366 |
| 2015/0296622 A1 | 10/2015 | Jiang |

OTHER PUBLICATIONS

"International Application Serial No. PCT/US2015/065080, International Search Report dated Sep. 1, 2016", 3 pgs.
"International Application Serial No. PCT/US2015/065080, Written Opinion dated Sep. 1, 2016", 9 pgs.

* cited by examiner

ATTACH DEVICES ON CARRIER

ATTACH FLEXIBLE DISPLAY PANELS

OVERMOLD DEVICES WITH FLEXIBLE MATERIAL

2ND ENCAPSULANT LAYER VIA MOLDING PROCESS

ATTACH 2ND CARRIER & REMOVE 1ST CARRIER

REMOVE 2ND CARRIER

FORM ROUTING LAYERS

ATTACH CONNECTOR & PROVIDE DEVICE CASING

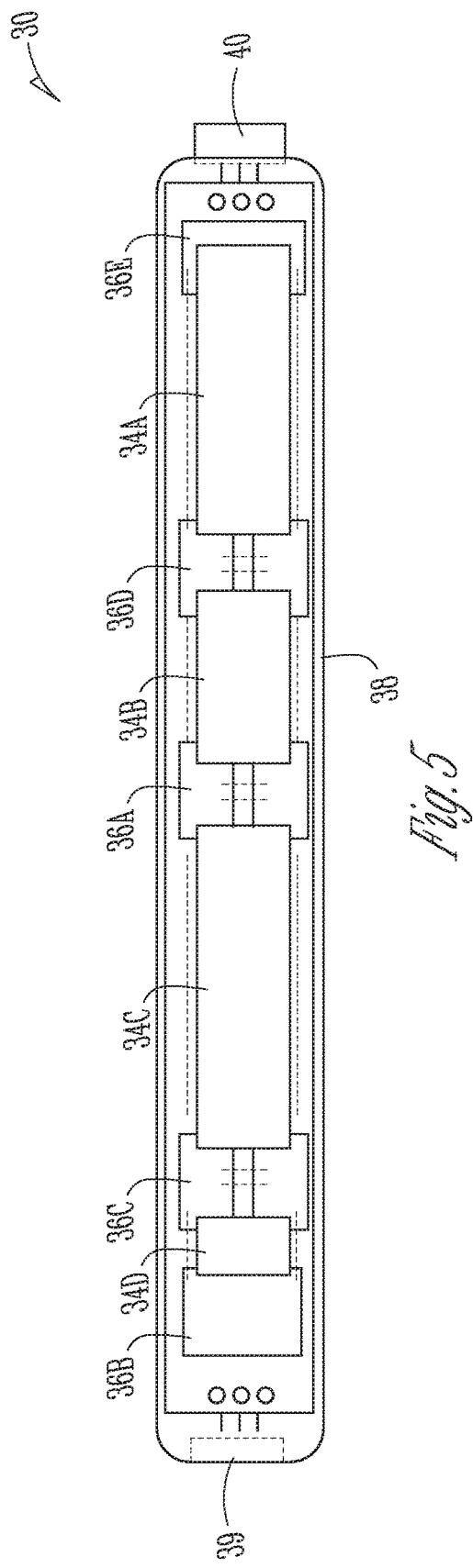
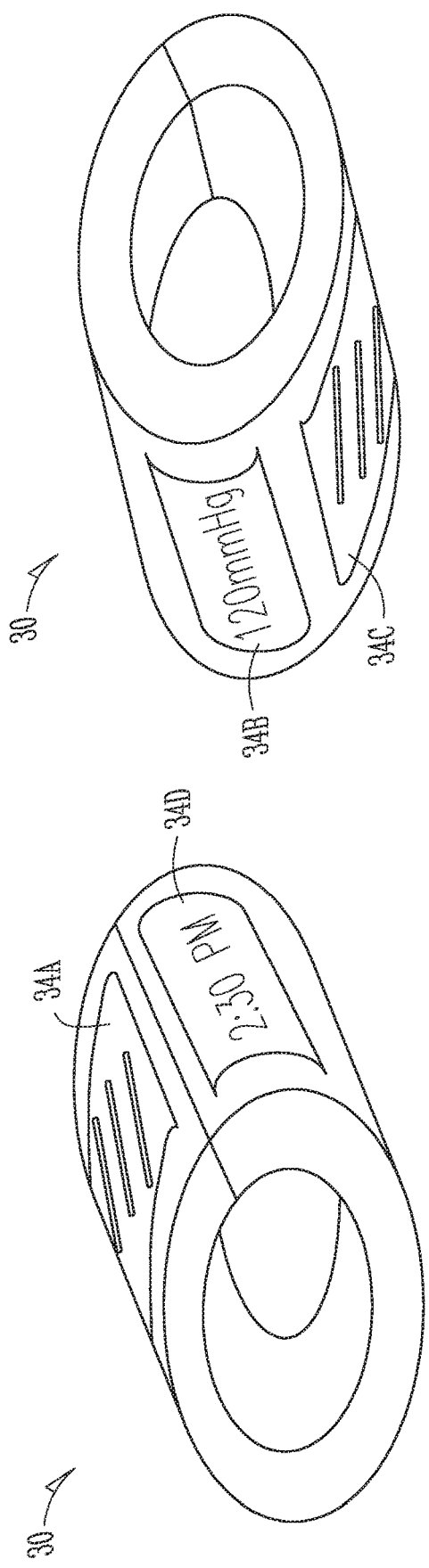
Fig. 5
Fig. 7
Fig. 6

FLEXIBLE COMPUTING DEVICE THAT INCLUDES A PLURALITY OF DISPLAYS

CROSS-REFERENCE TO RELATED APPLICATION

This application is a U.S. National Stage Filing under 35 U.S.C. 371 from International Application No. PCT/US2015/065080, filed on Dec. 10, 2015, and published as WO 2017/099784, which application is incorporated herein by reference in its entirety.

TECHNICAL FIELD

Embodiments described herein generally relate to a flexible computing device, and more particularly to a flexible computing display device that includes a plurality of displays.

BACKGROUND

Conventional wearable computing applications typically use stand-alone rigid devices (e.g., smart watches or glasses), or rigid bulky packs that snap into a connector on a garment or belt. Other types of applications use flexible/conformable patches in which a battery and sensors are integrated into a patch that is then adhesively bonded to the skin. Healthcare and fitness are example applications may utilize such computing devices.

One of the major design challenges that is associated with developing flexible/wearable computing device is the incorporation of displays into such electronic devices. One of the reasons that it is difficult to include displays into such electronic devices is that there are typically real estate limitations within the electronic devices. These real estate limitations often inhibit the higher degree of device integration (e.g., passives and sensors) that are required when including a display within an electronic device.

Another reason it is difficult to include displays into such electronic devices is that there is typically constraints on display panel size. As an example, a display is typically required to include additional components in order to provide sufficient thermal dissipation. These additional components may add unwanted size to the electronic devices that includes such displays. It is also usually desirable for the display to be of a certain size to promote an enhanced user experience.

Therefore, a need exists for flexible/wearable computing devices that may integrate various displays directly into a bracelet (i.e., wristband or ankle band), necklace, textile or some other application. As an example, when a display is to be included into a bracelet, the wearable computing devices should integrate the display directly into the bracelet without (i) adding to the discomfort of wearing the bracelet; (ii) adding significant cost to manufacturing the bracelet. The wearable computing devices should also include display(s) without (i) requiring a significant amount of added power to operate the display; and/or (ii) adding too much to the overall size of such wearable computing devices.

BRIEF DESCRIPTION OF THE DRAWINGS

FIG. 5 is a top view of the example of the flexible electronic device shown in FIG. 3.

FIG. 6 is an upper perspective view illustrating the flexible electronic device shown in FIGS. 3 and 5 assembled to form a bracelet-type device.

FIG. 7 is a lower perspective view illustrating the assembled flexible electronic device shown in FIG. 6.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The flexible integrated circuits and flexible electronic devices described herein may include a packaging architecture that permits direct integration of one or more flexible displays into the flexible integrated circuits and flexible electronic devices. The flexible integrated circuits and flexible electronic devices may be incorporated into low-profile wearable electronic devices while reducing the effects of heat that is generated within the wearable electronic devices as well as potentially providing an improved user experience.

The flexible integrated circuits and flexible electronic devices may include a packaging architecture that includes one or more flexible displays mounted to one side of polyimide-based dielectric layers and electronic components mounted on an opposing side of the polyimide-based dielectric layers. The polyimide-based dielectric layers may provide shorter electrical paths between different electronic components (e.g., sensors, platform controller hubs and displays) through direct vertical interconnection within the dielectric layers.

Figure 1:
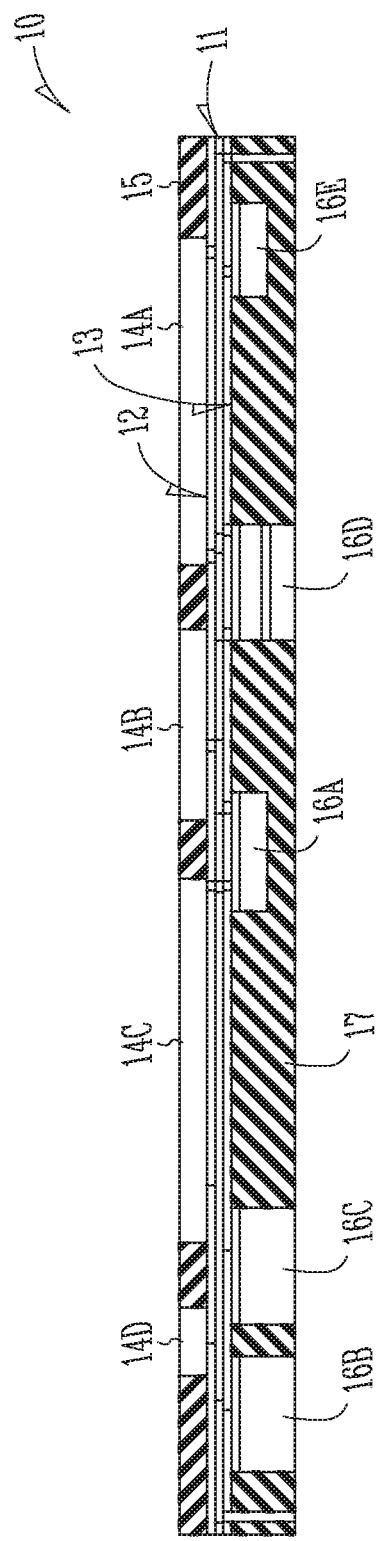
FIG. 1 is a schematic side view illustrating an example flexible integrated circuit that includes a plurality of displays.
Figure 2:
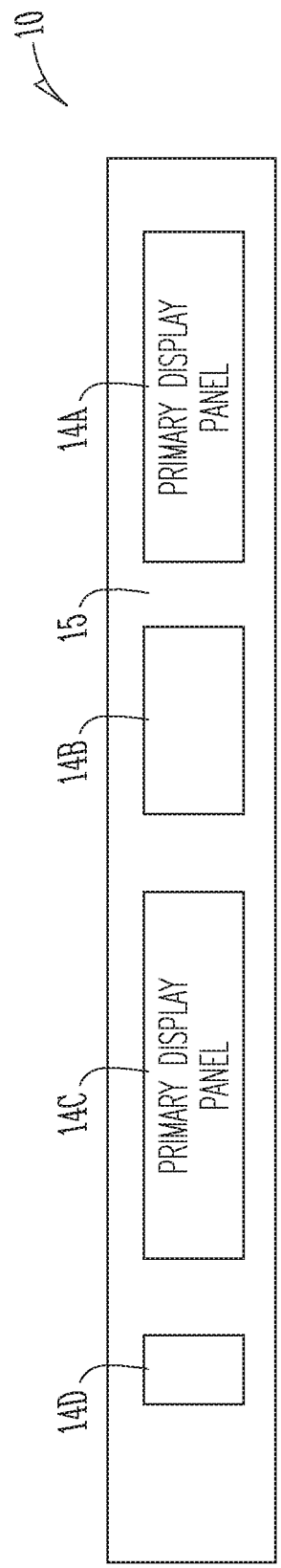
FIG. 2 is a top view of the example flexible integrated circuit shown in FIG. 1.

FIG. 1 is a schematic side view illustrating an example flexible integrated circuit 10 that includes a plurality of displays 14A, 14B, 14C, 14D. FIG. 2 is a top view of the example flexible integrated circuit 10 shown in FIG. 1.

The flexible integrated circuit 10 includes a flexible substrate 11 that includes an upper surface 12 and a lower surface 13. The flexible substrate 11 further includes interconnects extending between the upper surface 12 and the lower surface 13.

A flexible display 14A is mounted directly to the upper surface 12 of the flexible substrate 11 such that the flexible display 14A is electrically connected to the flexible substrate 11.

A first encapsulant 15 is mounted to the upper surface 12 of the flexible substrate 11. In some forms, the flexible display 14A is at least partially (or fully) embedded within the first encapsulant 15.

An electronic component 16A is mounted to the lower surface 13 of the flexible substrate 11. The electronic component 16A is electrically connected to the flexible substrate 11.

A second encapsulant 17 is mounted to the lower surface 13 of the flexible substrate 11. In some forms, the electronic component 16A is at least partially (or fully) embedded within the second encapsulant 17.

The first and second encapsulants 15, 17 may be partially, or fully, transparent. It should be noted that the first encapsulant 15 and the second encapsulant 17 may be the same materials or different materials. The type of first and second encapsulant 15, 17 that are included in the flexible integrated circuit 10 will depend in part on the application where the flexible integrated circuit 10 is to be used as well as manufacturing considerations that are associated with fabricating the flexible integrated circuit 10 (among other factors).

The type of flexible display 14A that is included in the flexible integrated circuit 10 will depend in part on (i) the application where the flexible integrated circuit 10 is to be used; (ii) the type of material that is used for the first encapsulant 15; and/or (iii) the manufacturing processes that are associated with fabricating the flexible integrated circuit 10 (among other factors).

The flexible substrate 11 may include a variety of different layers and be formed of a variety of different materials. The types of materials that are used for the dielectric layers and the flexible substrate 11 will depend in part on the application where the flexible integrated circuit 10 is to be used as well as the types of displays and electronic components that are to be mounted to the flexible substrate 11. Some example materials for the dielectric layers that form the flexible substrate 11 include, but are not limited to, Poly-Di-Methyl-Siloxane (PDMS) and other silicone-based elastomers, Thermo-Plastic-Polyurethane elastomers (TPUs), butyl rubber and other elastomer and elastomer-like materials (among other materials).

In addition, the flexible substrate 11 may include a variety of different shaped routings as well as various vertical interconnects extending between the dielectric layers that form the flexible substrate 11. The number, type and size of the layers, routings and interconnects within the flexible substrate will depend in part on the overall configuration of the flexible integrated circuit 10.

The flexible integrated circuit 10 may further include one or more additional flexible displays 14B, 14C, 14D that are mounted directly to the upper surface 12 of the flexible substrate 11. Each flexible display 14A, 14B, 14C, 14D may be electrically connected to the flexible substrate 11 and may be partially (or fully) embedded within the first encapsulant 15.

In the example flexible integrated circuits shown in FIGS. 1 and 2, the flexible displays 14A, 14B, 14C, 14D are different sizes. In some forms, some (or all) of the flexible displays may be the same size.

In addition, the flexible displays 14A, 14B, 14C, 14D may show information based on signals received from the electronic component 16A. In some forms, each of the flexible displays 14A, 14B, 14C, 14D may show different information than the information that is presented on the other displays.

In the flexible integrated circuit 10 shown in FIGS. 1 and 2, the flexible integrated circuit 10 further includes one or more additional electronic components 16B, 16C, 16D, 16E that are mounted to the lower surface 13 of the flexible substrate 11. Each electronic component 16A, 16B, 16C, 16D, 16E may be electrically connected to the flexible substrate 11 and may be at least partially (or fully) embedded within the second encapsulant 17.

As examples, the electronic components 16A, 16B, 16C, 16D, 16E may include at least one of a sensor, power supply, active component, passive component or global positioning system (among other types of electronic components). The types of electronic components that are included in the flexible integrated circuit 10 will depend in part on the application where the flexible integrated circuit 10 is to be used (among other factors).

The flexible integrated circuit 10 may provide enhanced electrical performance and a lower power consumption because the flexible integrated circuit has shorter interconnects between the electronic components 16A, 16B, 16C, 16D, 16E and the flexible displays 14A, 14B, 14C, 14D. In addition, the flexible integrated circuit 10 may operate under less intense thermal situations because the interconnects of the respective electronic components 16A, 16B, 16C, 16D, 16E and flexible displays 14A, 14B, 14C, 14D are segmented across the length of the flexible integrated circuit 10 instead of being limited within a confined space under a single display.

In addition, the flexible integrated circuit 10 may provide an enhanced user experience by including displays of different sizes. In addition, the flexible integrated circuit 10 may include primary and secondary displays that may be located in particular locations on an electronic device that includes the flexible integrated circuit 10.

In some forms, electrical coupling between the electronic components 16A, 16B, 16C, 16D, 16E and the flexible displays 14A, 14B, 14C, 14D is established through interconnects at the peripheral regions of the flexible displays 14A, 14B, 14C, 14D. Utilizing interconnects that are located at the peripheral edges of the flexible integrated circuit 10 may facilitate bending of the flexible integrated circuit 10 depending on the applications where the flexible integrated circuit 10 is to be used (among other factors).

Figure 3:
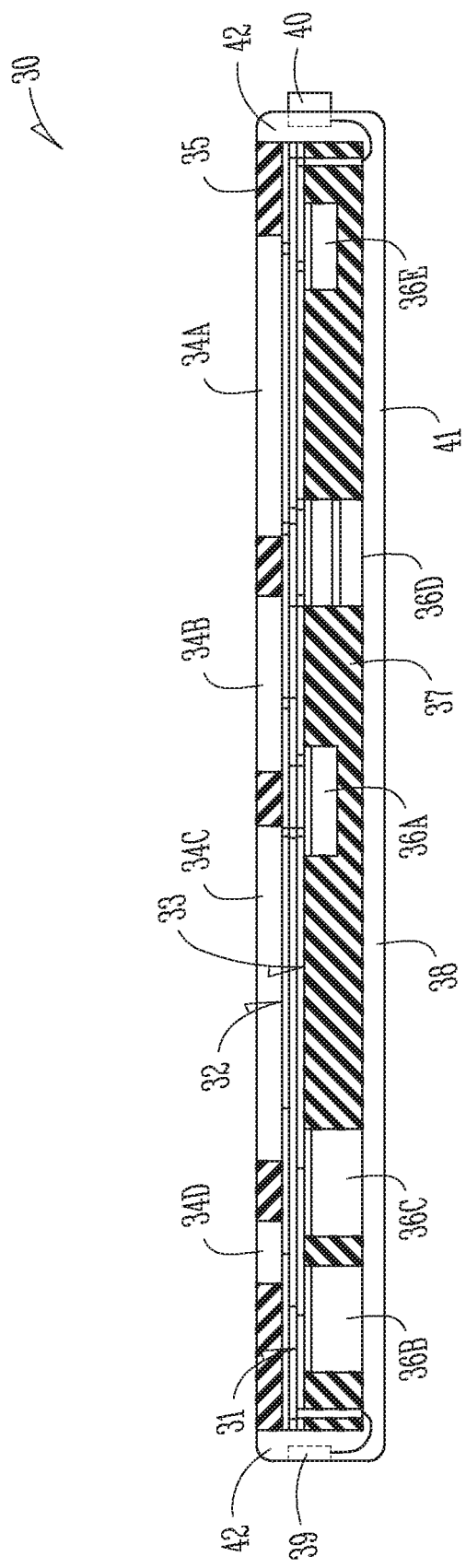
FIG. 3 is a schematic side view of an example flexible electronic device.
Figure 4A:
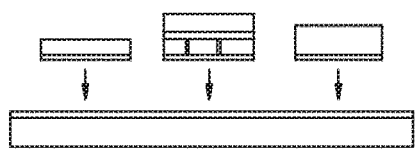
FIGS. 4A-4H illustrate example processes for fabricating the flexible electronic device shown in FIG. 3.
Figure 4E:
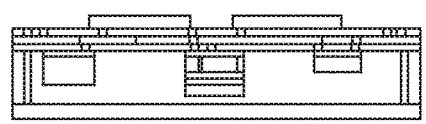
Figure 4B:
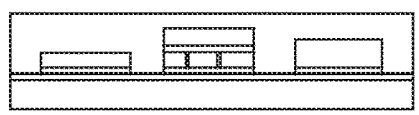
Figure 4F:
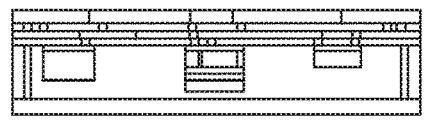
Figure 4C:
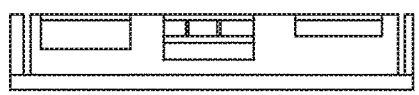
Figure 4G:
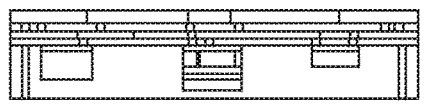
Figure 4D:
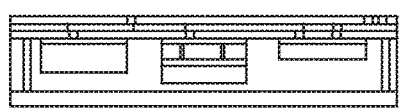
Figure 4H:
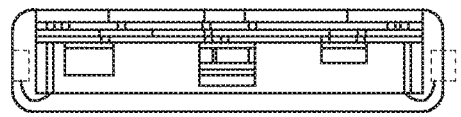

FIG. 3 is a schematic side view of an example flexible electronic device 30. The flexible electronic device 30 includes a flexible substrate 31 having an upper surface 32 and a lower surface 33. The flexible substrate 31 further includes interconnects that extend between the upper surface 32 and the lower surface 33.

A flexible display 34A is mounted directly to the upper surface 32 of the flexible substrate 31. The flexible display 34A is electrically connected to the flexible substrate 31.

A first encapsulant 35 is mounted to the upper surface 32 of the flexible substrate 31. The flexible display 34A may be at least partially embedded within the first encapsulant 35.

Electronic component 36A may be mounted to a lower surface 33 of the flexible substrate 31. The electronic component 36A is electrically connected to the flexible substrate 31.

A second encapsulant 37 is mounted to the lower surface 33 of the flexible substrate 31. The electronic component 36A is at least partially (or fully) embedded within the second encapsulant 37.

A flexible casing 38 surrounds the electronic component 36A and the second encapsulant 37. In some forms, the flexible casing 38 includes a base 41 that engages the second encapsulant 37 and side walls 42 that extend from the base 41 on each side of the flexible substrate 31.

In the example flexible electronic device 30 shown in FIG. 3, the side walls 42 and the base 41 of the flexible casing 38 are integral with one another. It should be noted that other forms are contemplated where the side walls 42 and the base are not integral with one another and formed of different (or the same) materials.

It should be noted that the flexible casings 38 described herein may be made from any of a variety of different materials, including polyester, polyimide, aramid, fiber-glass epoxy and silicone composites. Alternative materials include, but are not limited to, polysiloxanes, epoxy resins, acrylates, UV curable and O2/H2O initiated polyurethanes, benzocyclobutene, polyimide, polyamide, high-density polyethylene, BT resin, liquid crystal polymer, and polydimethylsiloxane.

The flexible electronic device 30 may further include one or more additional flexible displays 34B, 34C, 34D that are mounted directly to the upper surface 32 of the flexible substrate 31 such that each of the flexible displays 34A, 34B, 34C, 34D is electrically connected to the flexible substrate 31. Each flexible display 34A, 34B, 34C, 34D may be at least partially (or fully) embedded within the first encapsulant 35.

The flexible electronic device may further include one or more additional electronic components 36A, 36B, 36C, 36D, 36E that are mounted to a lower surface 33 of the flexible substrate 31 such that each of the electronic components 36A, 36B, 36C, 36D, 36E is electrically connected to the flexible substrate 31. Each of the electronic components 36A, 36B, 36C, 36D, 36E is at least partially (or fully) embedded within the second encapsulant 37.

In some forms, the flexible displays 34A, 34B, 34C, 34D show information based on signals received from one or more of the electronic components 36A, 36B, 36C, 36D, 36E. As an example, each flexible display 34A, 34B, 34C, 34D may show different (or the same) information than the information on the other displays.

It should be noted that the flexible displays 34A, 34B, 34C, 34D may be similar to any of the displays described above. In addition, the electronic components 36A, 36B, 36C, 36D, 36E may be similar to any of the electronic components described above.

It should be noted that the first and second encapsulants 35, 37 may also be similar to any of the encapsulants described above. In addition, the flexible substrate 31 may be similar to the flexible substrate 11 described above.

FIGS. 4A-4H illustrate example processes for fabricating the flexible electronic device 30 shown in FIG. 3. It should be noted that the illustrated example processes may be formed in a different order or include different manufacturing techniques.

FIGS. 4A-4H illustrate that the processes may utilize temporary carrier panels. The temporary carrier panels may have different configurations. As an example, the temporary carrier panels may have two copper layers that are separated by a weak layer to permit easy separation when separating the flexible integrated circuits 10 from the temporary carrier panels. It should be noted that a variety of configurations for the temporary carrier panels are contemplated and will depend in part on the materials and manufacturing processes that are utilized to fabricate the flexible integrated circuits 10.

It should be noted that in all of the processes that are shown and described herein, individual units may be singulated from a wafer panel. In addition, the singulated units may be encapsulated and/or attached to other electronic assemblies or electronic packages (i. e., flexible electronic assemblies or flexible electronic packages).

All of the illustrated processes are merely examples and other processes, materials, components, configurations and attachment methods may be utilized. These example processes should not be viewed as limiting the scope of the flexible electronic devices 30 described herein.

FIG. 5 is a top view of the example flexible electronic device 30 shown in FIG. 3. It should be noted that in FIG. 5 the first encapsulant 35 and the flexible substrate 31 are removed to illustrate an example spatial relationship between the flexible displays 34A, 34B, 34C, 34D and the electronic components 36A, 36B, 36C, 36D, 36E.

In another form of the flexible computing device 30, the flexible computing device 30 further includes a first connector 39 that is exposed from the flexible casing 38 and a second connector 40 that is also exposed from the flexible casing 38. The first and second connectors 39, 40 are electrically connected to the flexible substrate 31.

As shown most clearly in FIGS. 3 and 5, the first connector 39 extends into the flexible casing 38 and the second connector 40 extends from the flexible casing 38. In some forms, the second connector 40 is configured to be inserted into the first connector 39.

FIG. 6 is an upper perspective view illustrating the flexible electronic device 30 shown in FIGS. 3 and 5 assembled to form a bracelet-type device. FIG. 7 is a lower perspective view illustrating the assembled flexible electronic device 30 shown in FIG. 6. FIGS. 6 and 7 show the flexible electronic device 30 when the first and second connectors 39, 40 (not visible in FIGS. 6 and 7) are put together.

The first and second electrical connectors 39, 40 may provide for communication and/or power between the flexible electronic device 30 and external environments. As examples, the first and second electrical connectors 39, 40 may permit device charging, data transfer and other functions for the flexible electronic device 30.

It should be noted that the first and second connectors 39, 40 may have a variety of configurations. As an example, the first and second electrical connectors 39, 40 may be microconnectors such as USB Type-C. Other forms of the flexible electronic device 30 are contemplated where data transfer and device charging are performed wirelessly.

The types of connectors that are used as the first and second electrical connectors 39, 40 will depend in part on whether the flexible electronic device receives power and/or data through the first and second electrical connectors 39, 40. As an example one of the connectors may be configured to receive high speed I/O data transfer that is delivered to a control hub within the flexible electronic device 30 and the other connector may receive power that is supplied to charge a battery within the flexible electronic device 30.

The flexible integrated circuits 10 and flexible electronic devices 30 may (i) lower overall costs for comparable wearable devices that include displays; (ii) readily utilize encapsulants that may make the flexible integrated circuits 10 and flexible electronic devices 30 waterproof, (iii) permit the use of relatively simple circuitry to facilitate fabrication of the flexible integrated circuits 10 and flexible electronic devices 30; and/or (iv) permit integration of multiple displays into different flexible device applications. The flexible integrated circuits 10 and flexible electronic devices 30 that are described herein may be utilized in any application that is known now, or discovered in the future.

Figure 8:
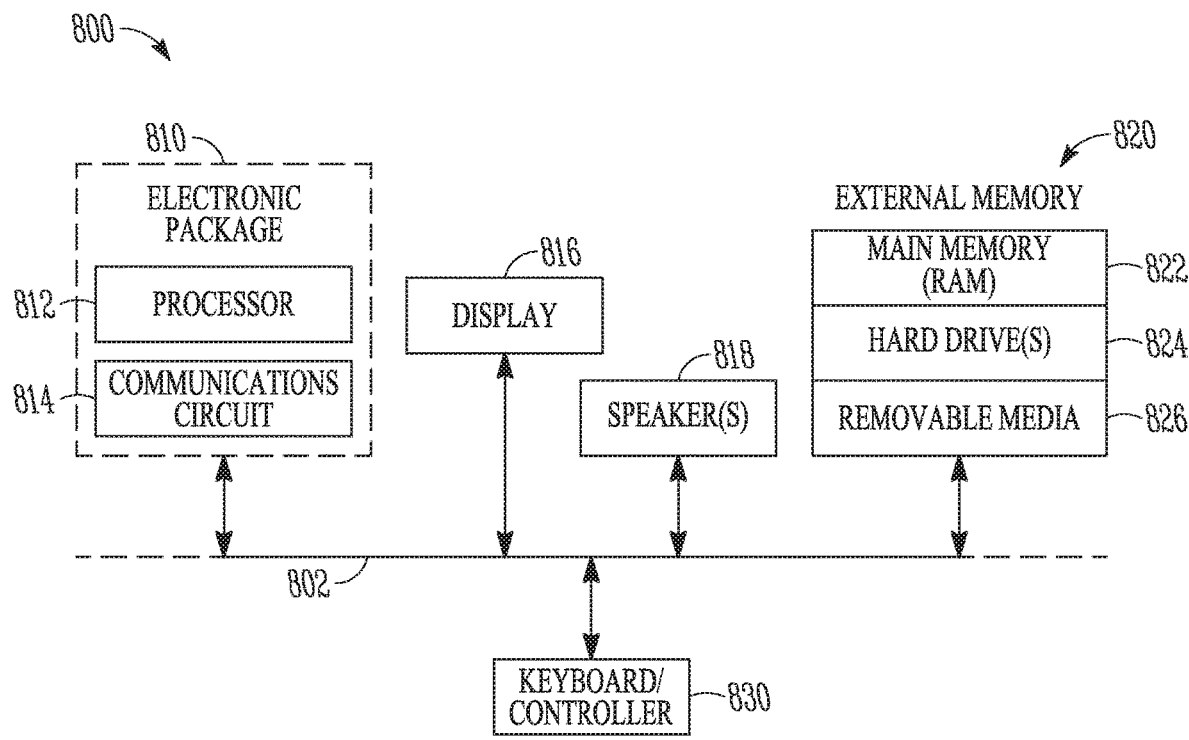
FIG. 8 is block diagram of an electronic apparatus that includes the flexible integrated circuits and/or the flexible electronic devices described herein.

FIG. 8 is a block diagram of an electronic apparatus 800 incorporating at least one of the flexible integrated circuits 10 or flexible electronic devices 30 described herein. Electronic apparatus 800 is merely one example of an electronic apparatus in which forms of the flexible integrated circuits 10 or flexible electronic devices 30 described herein may be used. Examples of an electronic apparatus 800 include, but are not limited to, personal computers, tablet computers, mobile telephones, game devices, MP3 or other digital media players, etc. In this example, electronic apparatus 800 comprises a data processing system that includes a system bus 802 to couple the various components of the electronic apparatus 800. System bus 802 provides communications links among the various components of the electronic apparatus 800 and may be implemented as a single bus, as a combination of busses, or in any other suitable manner.

An electronic apparatus 800 as describe herein may be coupled to system bus 802. The electronic apparatus 800 may include any circuit or combination of circuits. In one embodiment, the electronic apparatus 800 includes a processor 812 which can be of any type. As used herein, "processor" means any type of computational circuit, such as but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 800 are a custom circuit, an application-specific integrated circuit (ASIC), or the like, such as, for example, one or more circuits (such as a communications circuit 814) for use in wireless devices like mobile telephones, tablet computers, laptop computers, two-way radios, and similar electronic systems. The IC can perform any other type of function.

The electronic apparatus 800 may also include an external memory 820, which in turn may include one or more memory elements suitable to the particular application, such as a main memory 822 in the form of random access memory (RAM), one or more hard drives 824, and/or one or more drives that handle removable media 826 such as compact disks (CD), flash memory cards, digital video disk (DVD), and the like.

The electronic apparatus 800 may also include a display device 816, one or more speakers 818, and a keyboard and/or controller 830, which can include a mouse, trackball, touch pad, voice-recognition device, or any other device that permits a system user to input information into and receive information from the electronic apparatus 800.

To better illustrate the flexible integrated circuits 10 or flexible electronic devices 30 disclosed herein, a non-limiting list of examples is provided herein:

Example 1 includes a flexible integrated circuit. The flexible integrated circuit includes a flexible substrate that includes an upper surface and a lower surface and interconnects extending between the upper surface and the lower surface; a flexible display mounted directly to the upper surface of the flexible substrate such that the flexible display is electrically connected to the flexible substrate; a first encapsulant mounted to the upper surface of the flexible substrate such that the flexible display is at least partially embedded within the first encapsulant; an electronic component mounted to the lower surface of the flexible substrate such that the electronic component is electrically connected to the flexible substrate; and a second encapsulant mounted to the lower surface of the flexible substrate such that the electronic component is at least partially embedded within the second encapsulant.

Example 2 includes the flexible integrated circuit of example 1, and further including one or more additional flexible displays mounted directly to the upper surface of the flexible substrate such that each flexible display is electrically connected to the flexible substrate, wherein each flexible display is at least partially embedded within the first encapsulant.

Example 3 includes the flexible integrated circuit of any one of examples 1-2, wherein at least one of the flexible displays is a different size than the rest of the flexible displays.

Example 4 includes the flexible integrated circuit of any one of examples 1-3, wherein the flexible displays are configured to show information based on signals received from the electronic component.

Example 5 includes the flexible integrated circuit of examples 1-4, wherein each flexible display is configured to show different information than the information on the other displays.

Example 6 includes the flexible integrated circuit of any one of examples 1-5, and further including one or more additional electronic components mounted to a lower surface of the flexible substrate such that each electronic component is electrically connected to the flexible substrate, wherein each electronic component is at least partially embedded within the second encapsulant.

Example 7 includes the flexible integrated circuit of any one of examples 1-6, wherein the electronic components include at least one of a sensor, power supply, active component, passive components or global positioning system.

Example 8 includes the flexible integrated circuit of any one of examples 1-7, wherein the first encapsulant and the second encapsulant are different materials.

Example 9 includes the flexible integrated circuit of any one of examples 1-8, wherein the flexible substrate includes polyimide dielectric layers.

Example 10 includes a flexible electronic device. The flexible electronic device includes a flexible substrate that includes an upper surface and a lower surface and interconnects extending between the upper surface and the lower surface; a flexible display mounted directly to the upper surface of the flexible substrate such that the flexible display is electrically connected to the flexible substrate; a first encapsulant mounted to the upper surface of the flexible substrate such that the flexible display is at least partially embedded within the first encapsulant; an electronic component mounted to a lower surface of the flexible substrate such that the electronic component is electrically connected to the flexible substrate; a second encapsulant mounted to the lower surface of the flexible substrate such that the electronic component is at least partially embedded within the second encapsulant; and a flexible casing that surrounds the electronic component and the second encapsulant.

Example 11 includes the stretchable computing display device of example 10, wherein the flexible casing includes a base that engages the second encapsulant and side walls that extend from the base on each side of the flexible substrate.

Example 12 includes the stretchable computing display device of any one of examples 10-11, wherein the side walls and the base of the flexible casing are integral with one another and formed of the same material.

Example 13 includes the stretchable computing display device of examples 10-12, and further including one or more additional flexible displays mounted directly to the upper surface of the flexible substrate such that each flexible display is electrically connected to the flexible substrate, wherein each flexible display is at least partially embedded within the first encapsulant; and one or more additional electronic components mounted to a lower surface of the flexible substrate such that each electronic component is electrically connected to the flexible substrate, wherein each electronic component is at least partially embedded within the second encapsulant.

Example 14 includes the stretchable computing display device of examples 10-13, wherein the flexible displays are configured to show information based on signals received from the electronic components, and wherein each flexible display is configured to show different information than the information on the other displays.

Example 15 includes the stretchable computing display device of examples 10-14, wherein the electronic components include at least one of a sensor, power supply, active component, passive components or global positioning system, and wherein the first encapsulant and the second encapsulant are different materials.

Example 16 includes the stretchable computing display device of examples 10-15, wherein the flexible substrate includes polyimide dielectric layers.

Example 17 includes a flexible computing display device. The flexible computing display device includes a flexible substrate that includes an upper surface and a lower surface and interconnects extending between the upper surface and the lower surface; a flexible display mounted directly to the upper surface of the flexible substrate such that the flexible display is electrically connected to the flexible substrate; a first encapsulant mounted to the upper surface of the flexible substrate such that the flexible display is at least partially embedded within the first encapsulant; an electronic component mounted to a lower surface of the flexible substrate such that the electronic component is electrically connected to the flexible substrate; a second encapsulant mounted to the lower surface of the flexible substrate such that the electronic component is at least partially embedded within the second encapsulant; a flexible casing that surrounds the electronic component and the second encapsulant; a first connector that is exposed from the flexible casing, wherein the first connector is electrically connected to the flexible substrate; and a second connector that is exposed from the flexible casing, wherein the second connector is electrically connected to the flexible substrate.

Example 18 includes the flexible computing display device of example 17, wherein the first connector extends into the flexible casing and the second connector extends from the flexible casing.

Example 19 includes the flexible computing display device of any of examples 17-18, wherein the second connector is configured to be inserted into the first connector.

Example 20 includes the flexible computing display device of any of examples 17-19, and further including one or more additional flexible displays mounted directly to the upper surface of the flexible substrate such that each flexible display is electrically connected to the flexible substrate, wherein each flexible display is at least partially embedded within the first encapsulant; and one or more additional electronic components mounted to a lower surface of the flexible substrate such that each electronic component is electrically connected to the flexible substrate, wherein each electronic component is at least partially embedded within the second encapsulant, and wherein the flexible displays are configured to show information based on signals received from the electronic components, and wherein each flexible display is configured to show different information than the information on the other displays.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A flexible integrated circuit, comprising:
   a flexible substrate that includes an upper surface and a lower surface and interconnects extending between the upper surface and the lower surface;
   a plurality of flexible displays mounted directly to the upper surface of the flexible substrate such that each flexible display is electrically connected to the flexible substrate;
   a first encapsulant mounted to the upper surface of the flexible substrate such that each flexible display is at least partially embedded within the first encapsulant;
   an electronic component mounted to the lower surface of the flexible substrate such that the electronic component is electrically connected to the flexible substrate; and
   a second encapsulant mounted to the lower surface of the flexible substrate such that the electronic component is at least partially embedded within the second encapsulant.

2. The flexible integrated circuit of claim 1, wherein at least one of the flexible displays is a different size than the rest of the flexible displays.

3. The flexible integrated circuit of claim 1, wherein the flexible displays are configured to show information based on signals received from the electronic component.

4. The flexible integrated circuit of claim 1, wherein each flexible display is configured to show different information than the information on the other displays.

5. The flexible integrated circuit of claim 1, further comprising one or more additional electronic components mounted to a lower surface of the flexible substrate such that each electronic component is electrically connected to the flexible substrate, wherein each electronic component is at least partially embedded within the second encapsulant.

6. The flexible integrated circuit of claim 5, wherein the electronic components include at least one of a sensor, power supply, active component, passive components or global positioning system.

7. The flexible integrated circuit of claim 1, wherein the first encapsulant and the second encapsulant are different materials.

8. The flexible integrated circuit of claim 1, wherein the flexible substrate includes polyimide dielectric layers.

9. A flexible electronic device, comprising:
   a flexible substrate that includes an upper surface and a lower surface and interconnects extending between the upper surface and the lower surface;
   a plurality of flexible displays mounted directly to the upper surface of the flexible substrate such that each flexible display is electrically connected to the flexible substrate;
   a first encapsulant mounted to the upper surface of the flexible substrate such that each flexible display is at least partially embedded within the first encapsulant;
   an electronic component mounted to a lower surface of the flexible substrate such that the electronic component is electrically connected to the flexible substrate;
   a second encapsulant mounted to the lower surface of the flexible substrate such that the electronic component is at least partially embedded within the second encapsulant; and
   a flexible casing that surrounds the electronic component and the second encapsulant.

10. The flexible electronic device of claim 9, wherein the flexible casing includes a base that engages the second encapsulant and side walls that extend from the base on each side of the flexible substrate.

11. The flexible electronic device of claim 10, wherein the side walls and the base of the flexible casing are integral with one another and formed of the same material.

12. The flexible electronic device of claim 9, further comprising:
    one or more additional electronic components mounted to a lower surface of the flexible substrate such that each electronic component is electrically connected to the flexible substrate, wherein each electronic component is at least partially embedded within the second encapsulant.

13. The flexible computing display device of claim 12, wherein the flexible displays are configured to show information based on signals received from the electronic components, and wherein each flexible display is configured to show different information than the information on the other displays.

14. The flexible computing display device of claim 12, wherein the electronic components include at least one of a sensor, power supply, active component, passive components or global positioning system, and wherein the first encapsulant and the second encapsulant are different materials.

15. The flexible computing display device of claim 9, wherein the flexible substrate includes polyimide dielectric layers.

16. A flexible computing display device, comprising:
    a flexible substrate that includes an upper surface and a lower surface and interconnects extending between the upper surface and the lower surface;
    a flexible display mounted directly to the upper surface of the flexible substrate such that the flexible display is electrically connected to the flexible substrate;
    a first encapsulant mounted to the upper surface of the flexible substrate such that the flexible display is at least partially embedded within the first encapsulant;
    an electronic component mounted to a lower surface of the flexible substrate such that the electronic component is electrically connected to the flexible substrate;
    a second encapsulant mounted to the lower surface of the flexible substrate such that the electronic component is at least partially embedded within the second encapsulant;
    a flexible casing that surrounds the electronic component and the second encapsulant;
    a first connector that is exposed from the flexible casing, wherein the first connector is electrically connected to the flexible substrate; and
    a second connector that is exposed from the flexible casing, wherein the second connector is electrically connected to the flexible substrate.

17. The flexible computing display device of claim 16, wherein the first connector extends into the flexible casing and the second connector extends from the flexible casing.

18. The flexible computing display device of claim 17, wherein the second connector is configured to be inserted into the first connector.

19. The flexible computing display device of claim 16, further comprising:
    one or more additional flexible displays mounted directly to the upper surface of the flexible substrate such that each flexible display is electrically connected to the flexible substrate, wherein each flexible display is at least partially embedded within the first encapsulant; and one or more additional electronic components mounted to a lower surface of the flexible substrate such that each electronic component is electrically connected to the flexible substrate, wherein each electronic component is at least partially embedded within the second encapsulant, and wherein the flexible displays are configured to show information based on signals received from the electronic components, and wherein each flexible display is configured to show different information than the information on the other displays.

\* \* \* \* \*